(12) United States Patent
Son

(10) Patent No.: US 8,476,646 B2
(45) Date of Patent: Jul. 2, 2013

(54) LIGHT EMITTING DEVICE AND LIGHT EMITTING DEVICE PACKAGE

(75) Inventor: Hyo Kun Son, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 111 days.

(21) Appl. No.: 12/945,229

(22) Filed: Nov. 12, 2010

(65) Prior Publication Data

US 2011/0127550 A1 Jun. 2, 2011

(30) Foreign Application Priority Data

Nov. 30, 2009 (KR) ........................ 10-2009-0116993

(51) Int. Cl.
*H01L 27/15* (2006.01)
*H01L 31/12* (2006.01)
*H01L 33/00* (2010.01)

(52) U.S. Cl.
USPC .................. 257/79; 257/88; 257/98; 257/104; 257/E21.006; 257/E21.045; 257/E21.047; 257/E21.054; 257/E21.053; 257/E21.077; 257/E21.086; 257/E21.088; 257/E21.17; 257/E21.126; 257/E21.127

(58) Field of Classification Search
USPC ............. 257/79, 77, 78, 88, 98, 82, 104, 200, 257/201, E21.006, E21.045, E21.047, E21.054, 257/E21.053, E21.077, E21.086, E21.088, 257/E21.17, E21.352
See application file for complete search history.

(56) References Cited

U.S. PATENT DOCUMENTS

| | | | |
|---|---|---|---|
| 6,593,016 B1 | 7/2003 | Chiyo et al. | 428/698 |
| 2004/0206969 A1 | 10/2004 | Orita | 257/97 |
| 2005/0285132 A1 | 12/2005 | Orita | 257/99 |
| 2006/0091500 A1 | 5/2006 | Lee et al. | 257/615 |
| 2006/0202216 A1 | 9/2006 | Itonaga | 257/94 |
| 2008/0035953 A1 | 2/2008 | Beom et al. | 257/103 |
| 2009/0020772 A1* | 1/2009 | Chiu et al. | 257/98 |
| 2009/0110017 A1 | 4/2009 | Aihara | |
| 2009/0184334 A1 | 7/2009 | Lee et al. | 257/98 |
| 2009/0273003 A1 | 11/2009 | Park | 257/99 |
| 2011/0053298 A1 | 3/2011 | Yoon et al. | 438/27 |
| 2011/0140141 A1 | 6/2011 | Hahn et al. | 257/94 |

FOREIGN PATENT DOCUMENTS

| | | | |
|---|---|---|---|
| JP | 2006-093681 A | 4/2006 | |
| JP | 2006-253172 A | 9/2006 | |
| JP | 2009-016879 A | 1/2009 | |
| JP | 2009-27128 A | 2/2009 | |
| KR | 10-2001-0029852 A | 4/2001 | |
| KR | 10-2004-0090465 A | 10/2004 | |

(Continued)

OTHER PUBLICATIONS

Korean Office Action dated Mar. 30, 2011 issued in Application No. 10-2009-0116993.
Korean Office Action dated Jul. 20, 2011 issued in Application No. 10-2009-0116993.
Korean Notice of Allowance dated Sep. 24, 2011 issued in Application No. 10-2009-0116993.
Korean Office Action dated Dec. 8, 2010 issued in Application No. 10-2009-0116993.

*Primary Examiner* — David Nhu
(74) *Attorney, Agent, or Firm* — KED & Associates, LLP

(57) ABSTRACT

Provided is a light emitting device, which includes a second conductive type semiconductor layer, an active layer, a first conductive type semiconductor layer, and a intermediate refraction layer. The active layer is disposed on the second conductive type semiconductor layer. The first conductive type semiconductor layer is disposed on the active layer. The intermediate refraction layer is disposed on the first conductive type semiconductor layer. The intermediate refraction layer has a refractivity that is smaller than that of the first conductive type semiconductor layer and is greater than that of air.

17 Claims, 10 Drawing Sheets

FOREIGN PATENT DOCUMENTS

| | | |
|---|---|---|
| KR | 10-0674829 B1 | 5/2006 |
| KR | 10-2007-0026546 A | 3/2007 |
| KR | 10-2007-010557 A | 10/2007 |
| KR | 10-2008-0017237 A | 2/2008 |
| KR | 10-0816841 B1 | 3/2008 |
| KR | 2008-0058722 | 6/2008 |
| KR | 2008-0061695 | 7/2008 |
| KR | 2008-0093556 | 10/2008 |
| KR | 10-2009-0012494 A | 2/2009 |
| KR | 10-2009-0114826 A | 11/2009 |
| KR | 10-2010-0002485 A | 1/2010 |
| KR | 10-2010-0085635 A | 7/2010 |

* cited by examiner

LIGHT EMITTING DEVICE AND LIGHT EMITTING DEVICE PACKAGE

CROSS-REFERENCE TO RELATED APPLICATIONS

The present application claims priority under 35 U.S.C. §119(a) of Korean Patent Application No. 10-2009-0116993 filed on Nov. 30, 2009, which is hereby incorporated by reference in its entirety.

BACKGROUND

Embodiments relate to a light emitting device and a light emitting device package.

Light emitting diodes (LEDs) are semiconductor light emitting devices that convert an electric current into light. Recently, as the brightness of light emitting diodes is gradually improved, the light emitting diodes are widely used as light sources for displays, vehicles, and lighting devices. Furthermore, phosphors are used or light emitting diodes of various colors are combined to form a light emitting diode that emits efficient white light.

The brightness of a light emitting diode depends on various conditions including the structure of an active layer, an optical extraction structure for effectively extracting light to the outside, a semiconductor material of the light emitting diode, the size of a chip, and the type of a molding member enveloping the light emitting diode.

SUMMARY

Embodiments provide a light emitting device having an improved structure, and a light emitting device package.

Embodiments also provide a light emitting device having improved light extraction efficiency, and a light emitting device package.

In one embodiment, a light emitting device includes: a second conductive type semiconductor layer; an active layer on the second conductive type semiconductor layer; a first conductive type semiconductor layer on the active layer; and a intermediate refraction layer on the first conductive type semiconductor layer, wherein the intermediate refraction layer has a refractivity that is smaller than that of the first conductive type semiconductor layer and is greater than that of air.

In another embodiment, a light emitting device package includes: a body; a first electrode layer and a second electrode layer in the body; and a light emitting device in the body, the light emitting device being electrically connected to the first and second electrode layers, wherein the light emitting device includes: a second conductive type semiconductor layer; an active layer on the second conductive type semiconductor layer; a first conductive type semiconductor layer on the active layer; and a intermediate refraction layer on the first conductive type semiconductor layer, wherein the intermediate refraction layer has a refractivity that is smaller than that of the first conductive type semiconductor layer and is greater than that of air.

The details of one or more embodiments are set forth in the accompanying drawings and the description below. Other features will be apparent from the description and drawings, and from the claims.

DETAILED DESCRIPTION OF THE EMBODIMENTS

Figure 1:
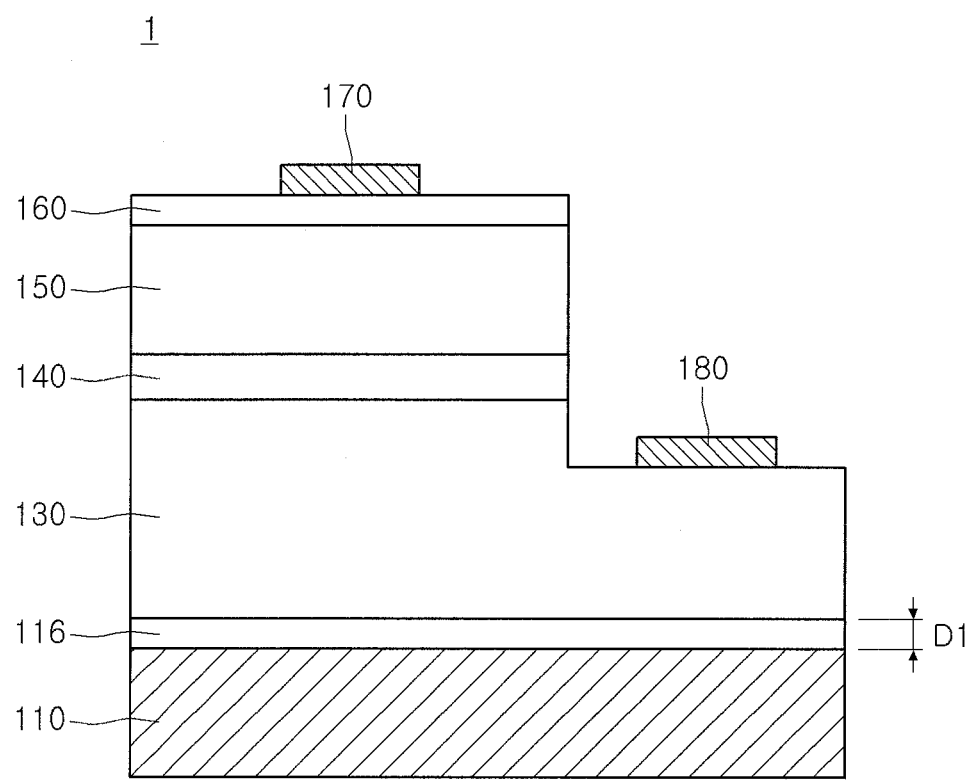
FIG. 1 is a cross-sectional view illustrating a light emitting device according to a first embodiment.

In the description of embodiments, it will be understood that when a layer (or film), region, pattern or structure is referred to as being 'on' or 'under' another layer (or film), region, pad or pattern, the terminology of 'on' and 'under' includes both the meanings of 'directly' and 'indirectly'. Further, the reference about 'on' and 'under' each layer will be made on the basis of drawings.

In the drawings, the thickness or size of each layer is exaggerated, omitted, or schematically illustrated for convenience in description and clarity. Also, the size of each element does not entirely reflect an actual size.

Hereinafter, a light emitting device and a method of manufacturing the same according to embodiments will be described with reference to the accompanying drawings.

First Embodiment

FIG. 1 is a cross-sectional view illustrating a light emitting device 1 according to a first embodiment.

Referring to FIG. 1, the light emitting device 1 may include a substrate 110, a intermediate refraction layer 116 disposed on the substrate 110, a first semiconductor layer 130 disposed on the intermediate refraction layer 116, an active layer 140 disposed on the first semiconductor layer 130, a second conductive type semiconductor layer 150 disposed on the active layer 140, an electrode layer 160 disposed on the second conductive type semiconductor layer 150, a first electrode 170 disposed on the electrode layer 160, and a second electrode 180 disposed on the first semiconductor layer 130.

The substrate 110 may be formed of at least one of sapphire ($Al_2O_3$), SiC, Si, GaAs, GaN, ZnO, Si, GaP, InP, and Ge, but the present disclosure is not limited thereto.

The substrate 110 has a first refractivity n1. For example, when the substrate 110 is formed of sapphire $Al_2O_3$, the first refractivity n1 may range from about 1.7 to about 1.8.

The intermediate refraction layer 116 may be disposed on the substrate 110.

The intermediate refraction layer 116 may have a second refractivity n2 that is between the first refractivity n1 of the substrate 110 and a third refractivity n3 of the first semiconductor layer 130.

That is, the second refractivity n2 of the intermediate refraction layer 116 may be greater than the first refractivity n1 of the substrate 110, and be smaller than the third refractivity n3.

A critical angle for total reflection is small in the interface between the substrate 110 and the first semiconductor layer 130, which have a large refractivity difference, and the amount of light absorbed and lost in the interface increases.

Thus, in the current embodiment, the intermediate refraction layer 116 having the second refractivity n2 is disposed between the substrate 110 and the first semiconductor layer 130 to minimize optical loss due to the refractivity difference between the substrate 110 and the first semiconductor layer 130.

The intermediate refraction layer 116 may include a semiconductor material such as one of AlN, GaN, AlGaN, InGaN, AlInGaN, AlInN, and InN, to have the second refractivity n2 and allow the first semiconductor layer 130 to be effectively formed thereon.

The intermediate refraction layer 116 may be formed at high temperature to have the second refractivity n2. For example, when the intermediate refraction layer 116 includes AlN, the AlN may be grown at a temperature ranging from about 1000° C. to about 1100° C., particularly, at a temperature of about 1050° C. Accordingly, the second refractivity n2 may range from about 2.1 to about 2.2.

The intermediate refraction layer 116 may have a thickness D1 ranging from about 0.05μ to about 0.1μ.

The intermediate refraction layer 116 may reduce a lattice constant difference between the substrate 110 and the first semiconductor layer 130 and decrease defects and dislocations of the first semiconductor layer 130.

The first semiconductor layer 130 may be disposed on the intermediate refraction layer 116.

The first semiconductor layer 130 may have the third refractivity n3, and include only a first conductive type semiconductor layer, or include both the first conductive type semiconductor layer and an undoped semiconductor layer under the first conductive type semiconductor layer, but the present disclosure is not limited thereto.

For example, the first conductive type semiconductor layer may include an n type semiconductor layer. The n type semiconductor layer may be formed of a semiconductor material having a composition formula of $In_xAl_yGa_{1-x-y}N$ ($0 \leq x \leq 1$, $0 \leq y \leq 1$, $0 \leq x+y \leq 1$) such as AlN, GaN, AlGaN, InGaN, AlInGaN, AlInN, or InN, and is doped with a n type dopant such as Si, Ge, or Sn.

For example, when the first semiconductor layer 130 includes GaN, the third refractivity n3 may range from about 2.45 to about 2.55.

For example, the undoped semiconductor layer may be an undoped GaN layer, but the present disclosure is not limited thereto.

The active layer 140 may be disposed on the first semiconductor layer 130.

In the active layer 140, electrons (or holes) injected through the first conductive type semiconductor layer meet holes (or electrons) injected through the second conductive type semiconductor layer 150, to emit light by a band gap of an energy band according to the material of the active layer 140.

The active layer 140 may have at least one of a single quantum well structure or a multi quantum well (MQW) structure, a quantum wire structure, and a quantum dot structure, but the present disclosure is not limited thereto.

A clad layer (not shown), which is doped with an n type or p type dopant, may be disposed at the upper side and/or the lower side of the active layer 140, and be formed as an AlGaN or InAlGaN layer.

The second conductive type semiconductor layer 150 is disposed on the active layer 140. For example, the second conductive type semiconductor layer 150 may be formed as a p type semiconductor layer. The p type semiconductor layer may be formed of a semiconductor material having a composition formula of $In_xAl_yGa_{1-x-y}N$ ($0 \leq x \leq 1$, $0 \leq y \leq 1$, $0 \leq x+y \leq 1$) such as AlN, GaN, AlGaN, InGaN, AlInGaN, AlInN, or InN, and be doped with a p type dopant such as Mg, Zn, Ca, Sr, and Ba.

The first conductive type semiconductor layer, the active layer 140, and the second conductive type semiconductor layer 150 are basic elements for forming a light emitting structure.

The first conductive type semiconductor layer and the second conductive type semiconductor layer 150 may be doped with a p type dopant and an n type dopant, respectively, but the present disclosure is not limited thereto. Although not shown, a third conductive type semiconductor layer (not shown) may be disposed on the second conductive type semiconductor layer 150. Thus, the light emitting device 100 may have a bonding structure with one of pn, np, pnp, and npn.

The intermediate refraction layer 116, the first semiconductor layer 130, the active layer 140, and the second conductive type semiconductor layer 150 may be formed using a method such as metal organic chemical vapor deposition (MOCVD), chemical vapor deposition (CVD), plasma-enhanced chemical vapor deposition (PECVD), molecular beam epitaxy (MBE), and hydride vapor phase epitaxy (HYPE), but the present disclosure is not limited thereto.

The electrode layer 160 may be disposed on the second conductive type semiconductor layer 150. The electrode layer 160 may be formed of a transparent material that may include, e.g., at least one of ITO, IZO (In—ZnO), GZO (Ga—ZnO), AZO (Al—ZnO), AGZO (Al—Ga ZnO), IGZO (In—Ga ZnO), IrOx, RuOx, RuOx/ITO, Ni/IrOx/Au, and Ni/IrOx/Au/ITO.

Alternatively, the electrode layer 160 may be a reflective electrode, and include at least one of silver (Ag), aluminum (Al), platinum (Pt), or palladium (Pd), which has high reflectivity.

The first electrode 170 may be disposed on the electrode layer 160, and the second electrode 180 may be disposed on the first semiconductor layer 130. The second electrode 180 may be formed after performing a mesa etching on the light emitting device 1 to expose the first semiconductor layer 130. The first electrode 170 and the second electrode 180 supply power to the light emitting device 1.

Alternatively, the first electrode 170 may be formed on the second conductive type semiconductor layer 150 without the electrode layer 160, but the present disclosure is not limited thereto.

Second Embodiment

Hereinafter, a light emitting device 2 and a method of manufacturing the same according to a second embodiment will be described. Here, different parts between the first and second embodiments will be described principally, and a description of the same parts thereof will be omitted.

Figure 2:
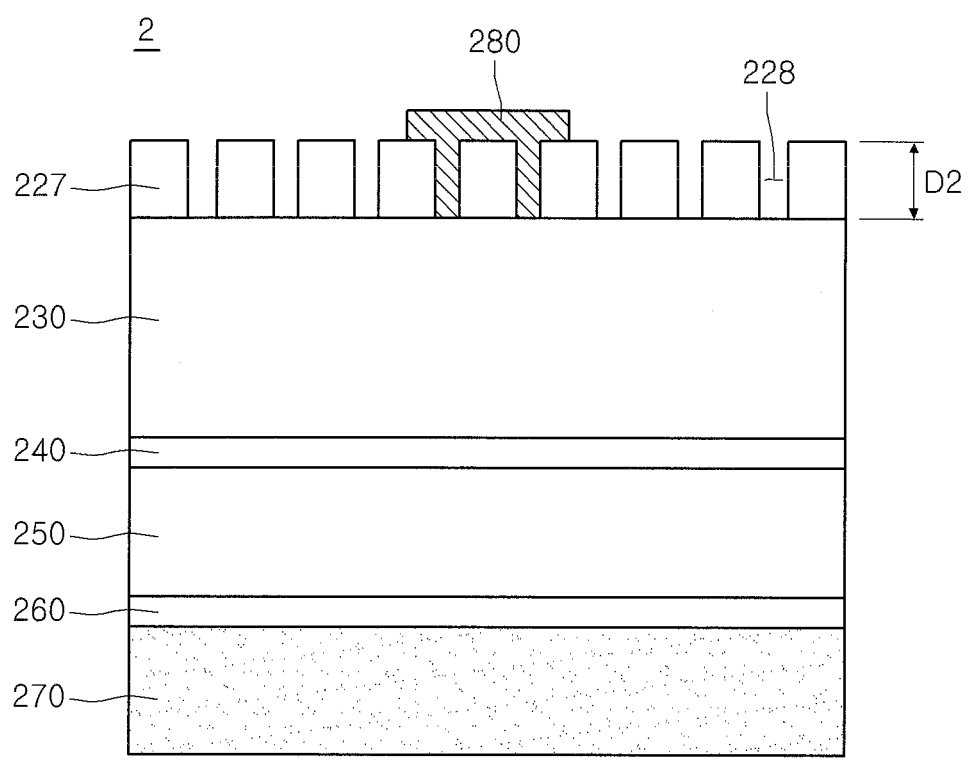
FIG. 2 is a cross-sectional view illustrating a light emitting device according to a second embodiment.

FIG. 2 is a cross-sectional view illustrating the light emitting device 2 according to the second embodiment.

Referring to FIG. 2, the light emitting device 2 may include a conductive support member 270, a reflective layer 260 disposed on the conductive support member 270, a second conductive type semiconductor layer 250 disposed on the reflective layer 260, an active layer 240 disposed on the second conductive type semiconductor layer 250, a first semiconductor layer 230 disposed on the active layer 240, a second intermediate refraction layer 227 disposed on the first semiconductor layer 230, and a third electrode 280 disposed on the first semiconductor layer 230.

The conductive support member 270 may be formed of titanium (Ti), chrome (Cr), nickel (Ni), aluminum (Al), platinum (Pt), gold (Au), tungsten (W), copper (Cu), molybdenum (Mo), copper-tungsten (Cu—W), and a carrier wafer such as Si, Ge, GaAs, ZnO, SiC, SiGe, and GaN. The third electrode 280 and the conductive support member 270 supply power to the light emitting device 2.

The reflective layer 260 may be disposed on the conductive support member 270.

The reflective layer 260 may include at least one of silver (Ag), aluminum (Al), platinum (Pt), or palladium (Pd), which has high reflectivity.

A bonding layer (not shown) may be disposed between the conductive support member 270 and the reflective layer 260 to improve interface coupling force thereof.

The second conductive type semiconductor layer 250 may be disposed on the reflective layer 260. For example, the second conductive type semiconductor layer 250 may include a p type semiconductor layer. The p type semiconductor layer may be formed of a semiconductor material having a composition formula of $In_xAl_yGa_{1-x-y}N$ ($0 \leq x \leq 1$, $0 \leq y \leq 1$, $0 \leq x+y \leq 1$) such as AlN, GaN, AlGaN, InGaN, AlInGaN, AlInN, or InN, and be doped with a p type dopant such as Mg, Zn, Ca, Sr, or Ba.

An ohmic layer (not shown) may be disposed between the second conductive type semiconductor layer 250 and the reflective layer 260 for an ohmic contact therebetween.

The active layer 240 may be disposed on the second conductive type semiconductor layer 250. In the active layer 240, electrons (or holes) injected through the first semiconductor layer 230 meet holes (or electrons) injected through the second conductive type semiconductor layer 250 to be formed later, to emit light by a band gap of an energy band according to the material of the active layer 240.

The active layer 240 may have at least one of a single quantum well structure or a multi quantum well (MQW) structure, a quantum wire structure, and a quantum dot structure, but the present disclosure is not limited thereto.

A clad layer (not shown), which is doped with an n type or p type dopant, may be disposed at the upper side and/or the lower side of the active layer 240, and be formed as an AlGaN or InAlGaN layer.

The first semiconductor layer 230 may be disposed on the active layer 240.

The first semiconductor layer 230 may have a third refractivity $n3$, and include only a first conductive type semiconductor layer, or include both the first conductive type semiconductor layer and an undoped semiconductor layer under the first conductive type semiconductor layer, but the present disclosure is not limited thereto.

For example, the first conductive type semiconductor layer may include an n type semiconductor layer. The n type semiconductor layer may be formed of a semiconductor material having a composition formula of $In_xAl_yGa_{1-x-y}N$ ($0 \leq x \leq 1$, $0 \leq y \leq 1$, $0 \leq x+y \leq 1$) such as AlN, GaN, AlGaN, InGaN, AlInGaN, AlInN, or InN, and is doped with a n type dopant such as Si, Ge, or Sn.

For example, when the first semiconductor layer 230 includes GaN, the third refractivity $n3$ may range from about 2.45 to about 2.55.

The second intermediate refraction layer 227 may be disposed on the first semiconductor layer 230. The second intermediate refraction layer 227 may have a second refractivity $n2$ that is between the third refractivity $n3$ of the first semiconductor layer 230 and a fourth refractivity $n4$ of air.

The fourth refractivity $n4$ of air is about 1.0, and the second refractivity $n2$ of the second intermediate refraction layer 227 may be smaller than the third refractivity $n3$ of the first semiconductor layer 230 and be greater than the fourth refractivity $n4$ of air.

A critical angle for total reflection is small in the interface between the first semiconductor layer 230 and the air, which have a large refractivity difference, and the amount of light absorbed and lost in the interface increases.

Thus, in the current embodiment, the second intermediate refraction layer 227 having the second refractivity $n2$ is disposed on the first semiconductor layer 230 to minimize optical loss due to the refractivity difference of light emitted from the first semiconductor layer 230 to air.

The second intermediate refraction layer 227 may include a semiconductor material having the second refractivity $n2$ and efficiently forming the first semiconductor layer 130, such as one of AlN, GaN, AlGaN, InGaN, AlInGaN, AlInN, and InN, but the present disclosure is not limited thereto. However, in the current embodiment, the second intermediate refraction layer 227 includes AlN.

The second intermediate refraction layer 227 may be formed at high temperature to have the second refractivity $n2$. For example, when the second intermediate refraction layer 227 includes AlN, the AlN may be grown at a temperature ranging from about 1000° C. to about 1100° C., particularly, at a temperature of about 1050° C. Accordingly, the second refractivity $n2$ may range from about 2.1 to about 2.2.

Figure 3:
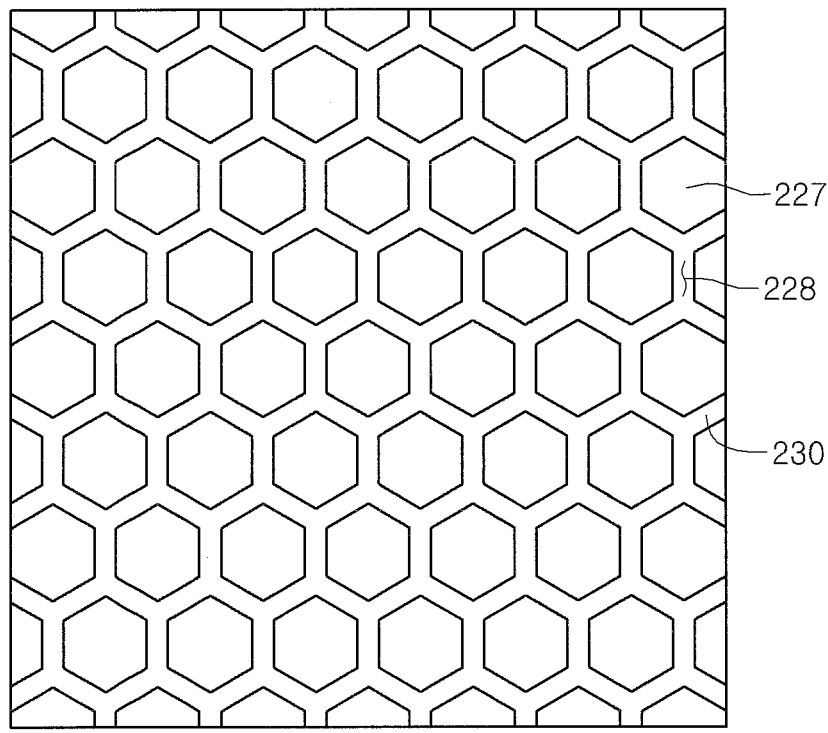
FIG. 3 is a plan view of the light emitting device shown in FIG. 2.

FIG. 3 is a plan view illustrating the second intermediate refraction layer 227 of the light emitting device 2 according to the second embodiment.

Referring to FIG. 3, when the second intermediate refraction layer 227 includes AlN and has a second thickness D2 ranging from about 0.5 μm to about 1.0 μm, the second intermediate refraction layer 227 may have a plurality of patterns spaced apart from one another, for example, a plurality of polygonal columns.

However, the second intermediate refraction layer 227 may include a plurality of cylinders or flat layers, but the present disclosure is not limited thereto.

For the second intermediate refraction layer 227 to have a plurality of polygonal columns, a mask pattern (not shown) is formed on the first semiconductor layer 230, and the second intermediate refraction layer 227 may be formed using the mask pattern (not shown). The mask pattern (not shown) may include $SiO_2$ and MgN, but the present disclosure is not limited thereto.

When the second intermediate refraction layer 227 includes a plurality of polygonal columns or a plurality of cylinders, the second intermediate refraction layer 227 emits light, emitted from the active layer 240, at various angles to improve the light extraction efficiency of the light emitting device 2.

The third electrode 280 may be disposed on the first semiconductor layer 230. The third electrode 280 is disposed on the second intermediate refraction layer 227, and is electrically connected to the first semiconductor layer 230 between the patterns of the second intermediate refraction layer 227.

The third electrode 280 may be formed by removing a portion of the second intermediate refraction layer 227, but the present disclosure is not limited thereto.

Hereinafter, a method of manufacturing the light emitting device 2 will now be described with reference to FIGS. 4 to 8. For convenience in description, in the method of manufacturing the light emitting device 2, the light emitting device 2 illustrated in FIG. 2 is reversed.

Figure 4:
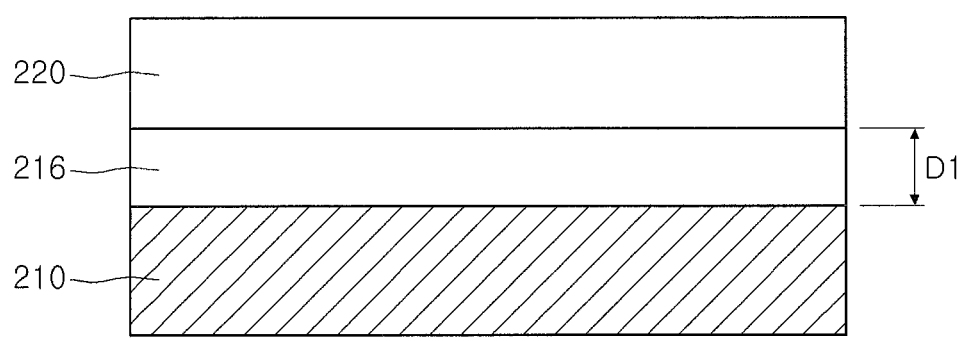
FIGS. 4 to 8 are cross-sectional views illustrating a method of manufacturing a light emitting device according to the second embodiment.

Referring to FIG. 4, a first intermediate refraction layer 216 may be formed on a substrate 210, and an undoped semiconductor layer 220 may be formed on the first intermediate refraction layer 216.

The first intermediate refraction layer 216 may include the same material as that of the second intermediate refraction layer 227 (refer to FIG. 6) to be formed later. For example, the first intermediate refraction layer 216 may include one of AlN, GaN, AlGaN, InGaN, AlInGaN, AlInN, and InN.

The first intermediate refraction layer 216 may have a first thickness D1 ranging from about 0.05 μm to about 0.1 μm.

The first intermediate refraction layer 216 may reduce a lattice constant difference between the substrate 210 and the undoped semiconductor layer 220, and decrease a defect and dislocation of the undoped semiconductor layer 220.

Since the undoped semiconductor layer 220 is not doped with a conductive dopant, the undoped semiconductor layer 220 is significantly lower in electric conductivity than the first and second semiconductor layer 230 and 250. For example, the undoped semiconductor layer 220 may be an undoped GaN layer, but the present disclosure is not limited thereto.

The upper portion of the undoped semiconductor layer 220 may include a first conductive type semiconductor layer, but the present disclosure is not limited thereto.

Figure 5:
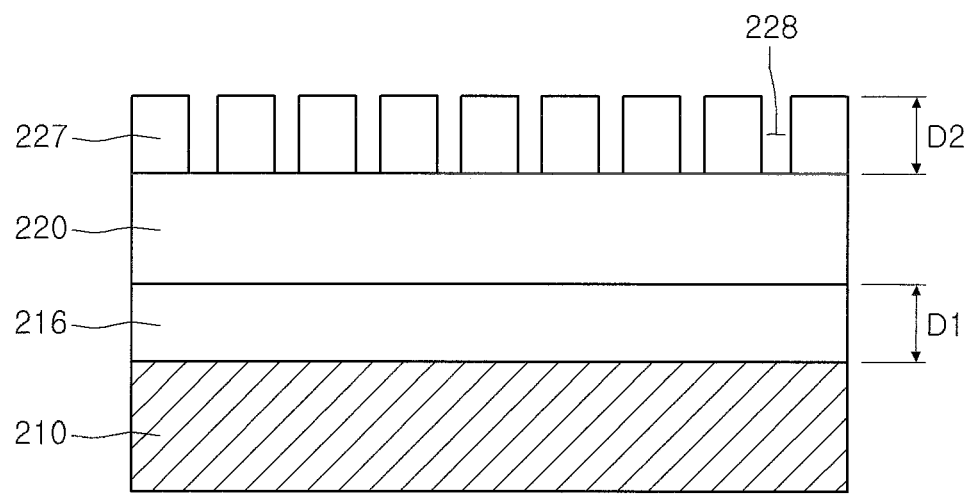

Referring to FIG. 5, the second intermediate refraction layer 227 may be formed on the undoped semiconductor layer 220.

The second intermediate refraction layer 227 may have the second refractivity n2 that is between the third refractivity n3 of the first semiconductor layer 230 and the fourth refractivity n4 of air.

The second intermediate refraction layer 227 having the second refractivity n2 is disposed on the first semiconductor layer 230 to minimize the loss due to a refractivity difference of light emitted from the first semiconductor layer 230 to air.

The second intermediate refraction layer 227 may include a semiconductor material having the second refractivity n2 and efficiently forming the first semiconductor layer 230, such as one of AlN, GaN, AlGaN, InGaN, AlInGaN, AlInN, and InN, but the present disclosure is not limited thereto. However, in the current embodiment, the second intermediate refraction layer 227 includes AlN.

The second intermediate refraction layer 227 may be formed at high temperature to have the second refractivity n2. For example, when the second intermediate refraction layer 227 includes AlN, the AlN may be grown at a temperature ranging from about 1000° C. to about 1100° C., particularly, at a temperature of about 1050° C. Accordingly, the second refractivity n2 may range from about 2.1 to about 2.2.

Figure 8:
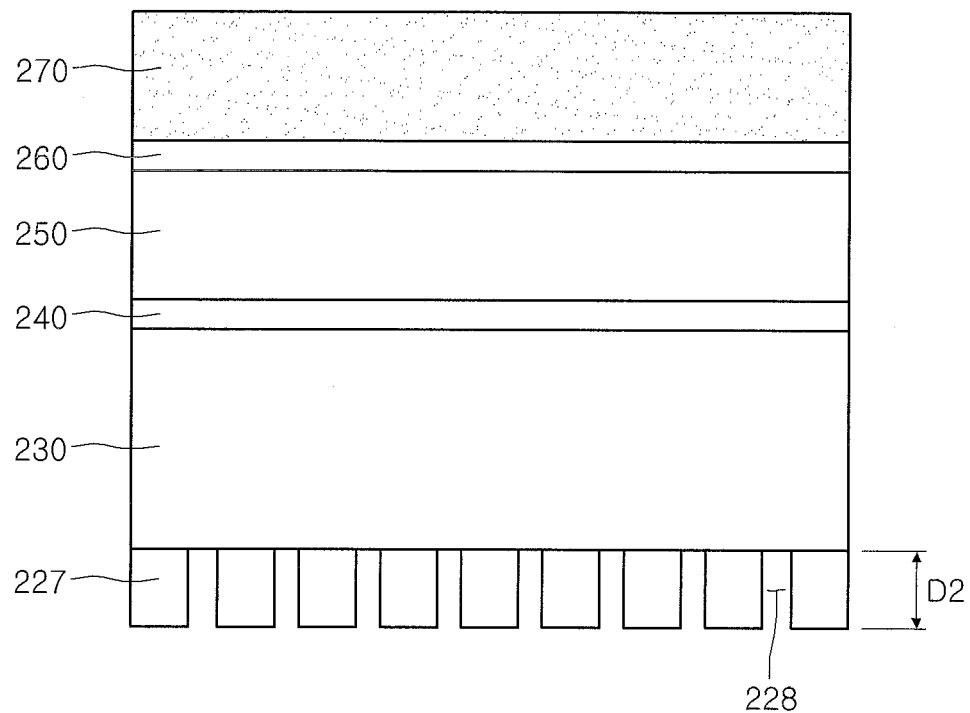

Referring to FIG. 8, when the second intermediate refraction layer 227 includes AlN and has the second thickness D2 ranging from about 0.5 μm to about 1.0 μm, the second intermediate refraction layer 227 may have a plurality of polygonal columns.

However, the second intermediate refraction layer 227 may include a plurality of cylinders or flat layers, but the present disclosure is not limited thereto.

For the second intermediate refraction layer 227 to have a plurality of polygonal columns, a mask pattern (not shown) is formed on the first semiconductor layer 230, and the second intermediate refraction layer 227 may be formed using the mask pattern (not shown). The mask pattern (not shown) may include SiO2 and MgN, but the present disclosure is not limited thereto.

When the second intermediate refraction layer 227 includes a plurality of polygonal columns or a plurality of cylinders, the second intermediate refraction layer 227 emits light, emitted from the active layer 240, at various angles to improve the light extraction efficiency of the light emitting device 2.

Figure 6:
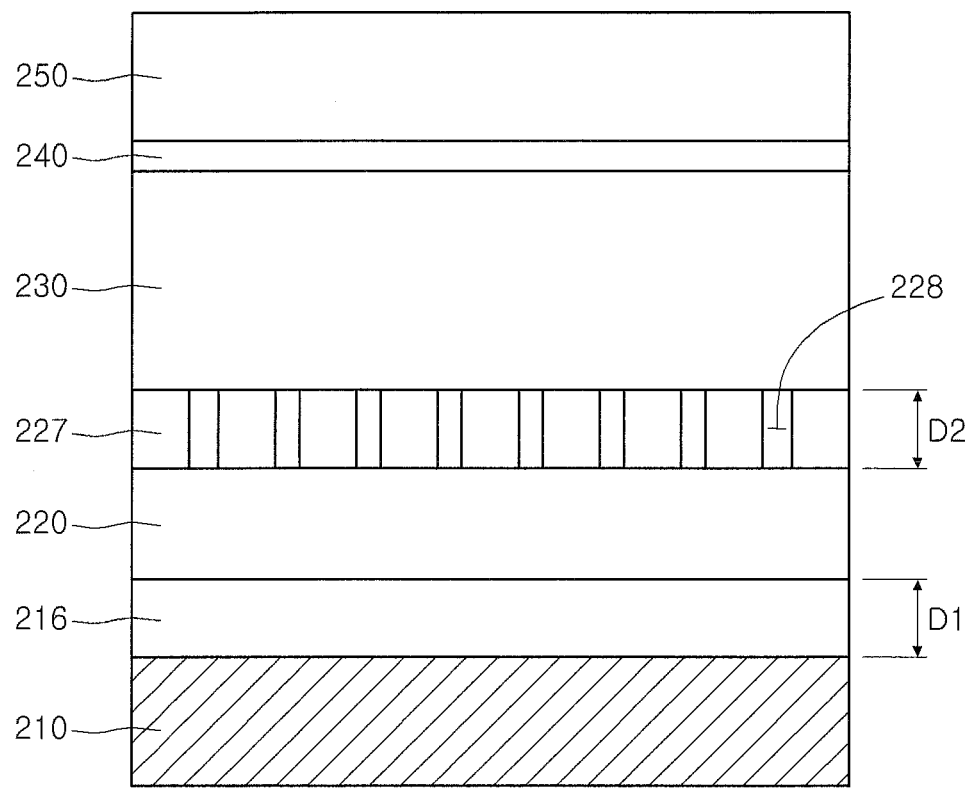

Referring to FIG. 6, the first semiconductor layer 230 may be formed on the second intermediate refraction layer 227, and the active layer 240 may be formed on the first semiconductor layer 230, and the second conductive type semiconductor layer 250 may be formed on the active layer 240.

The first semiconductor layer 230, the active layer 240, and the second conductive type semiconductor layer 250 constitute a light emitting structure.

The light emitting structure may be formed using a method such as metal organic chemical vapor deposition (MOCVD), chemical vapor deposition (CVD), plasma-enhanced chemical vapor deposition (PECVD), molecular beam epitaxy (MBE), and hydride vapor phase epitaxy (HVPE), but the present disclosure is not limited thereto.

The light emitting structure may be horizontally and/or vertically grown through an epitaxy lateral growth (ELO) process. The light emitting structure may be formed on the second intermediate refraction layer 227 by appropriately adjusting a condition such as the temperature or pressure of the ELO process.

However, while the light emitting structure is formed, portions of the light emitting structure may be grown in spaces 228 between the polygonal columns of the second intermediate refraction layer 227, but the present disclosure is not limited thereto.

Since the first semiconductor layer 230 is formed on the second intermediate refraction layer 227, defects or dislocations of the first semiconductor layer 230 are reduced, so that crystalline characteristics of the first semiconductor layer 230 can be improved.

The first semiconductor layer 230 may include only a first conductive type semiconductor layer, or include both the first conductive type semiconductor layer and an undoped semiconductor layer under the first conductive type semiconductor layer, but the present disclosure is not limited thereto.

The undoped semiconductor layer 220 formed under the second intermediate refraction layer 227 may be the same as the first semiconductor layer 230 formed on the second intermediate refraction layer 227. That is, the first semiconductor layer 230 may be formed, then, the second intermediate refraction layer 227 may be formed on the first semiconductor layer 230, and then, the first semiconductor layer 230 may be formed again on the second intermediate refraction layer 227, but the present disclosure is not limited thereto.

Figure 7:
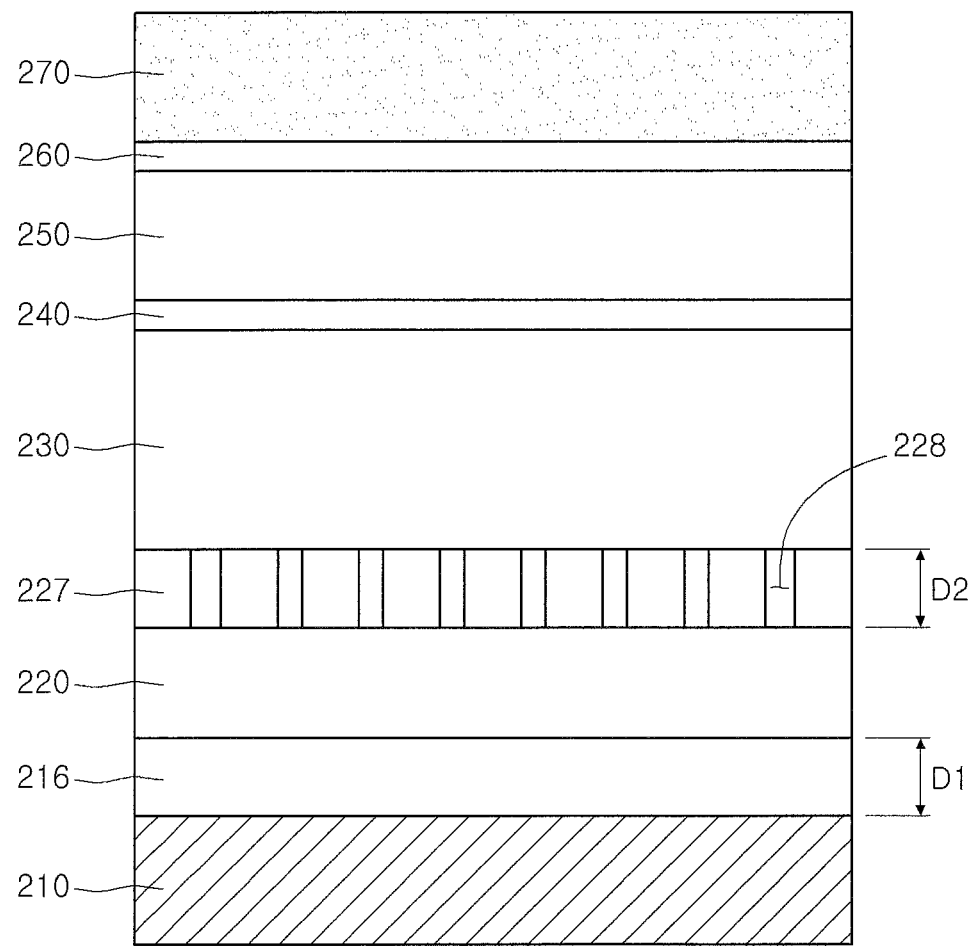

Referring to FIG. 7, the reflective layer 260 may be formed on the second conductive type semiconductor layer 250, and the conductive support member 270 may be formed on the reflective layer 260.

The conductive support member 270 supplies power to the light emitting device 2, and supports the light emitting structure.

Referring to FIGS. 7 and 8, the substrate 210, the first intermediate refraction layer 216, and the undoped semiconductor layer 220 may be removed.

The substrate 210 may be removed through at least one of a laser lift off (LLO) process and an etching process, but the present disclosure is not limited thereto.

The first intermediate refraction layer 216 and the undoped semiconductor layer 220 may be removed through an etching process such as inductively coupled plasma/reactive ion etch (ICP/RIE).

In this case, the second intermediate refraction layer 227 may function as an etching stop layer for stopping the etching process.

The first intermediate refraction layer 216 and the undoped semiconductor layer 220 are removed to expose the first semiconductor layer 230 and the second intermediate refraction layer 227.

Referring to FIGS. 2 and 8, the third electrode 280 may be formed on the first semiconductor layer 230. At this point, the second intermediate refraction layer 227 may be partially removed, and then, the third electrode 280 may be formed, but the present disclosure is not limited thereto.

Third Embodiment

Hereinafter, a light emitting device 3 and a method of manufacturing the same according to a third embodiment will be described. Here, different parts between the second and third embodiments will be described principally, and a description of the same parts thereof will be omitted.

The light emitting device 3 is similar to the light emitting device 2 except that a second intermediate refraction layer is removed and a roughness pattern is formed.

Figure 9:
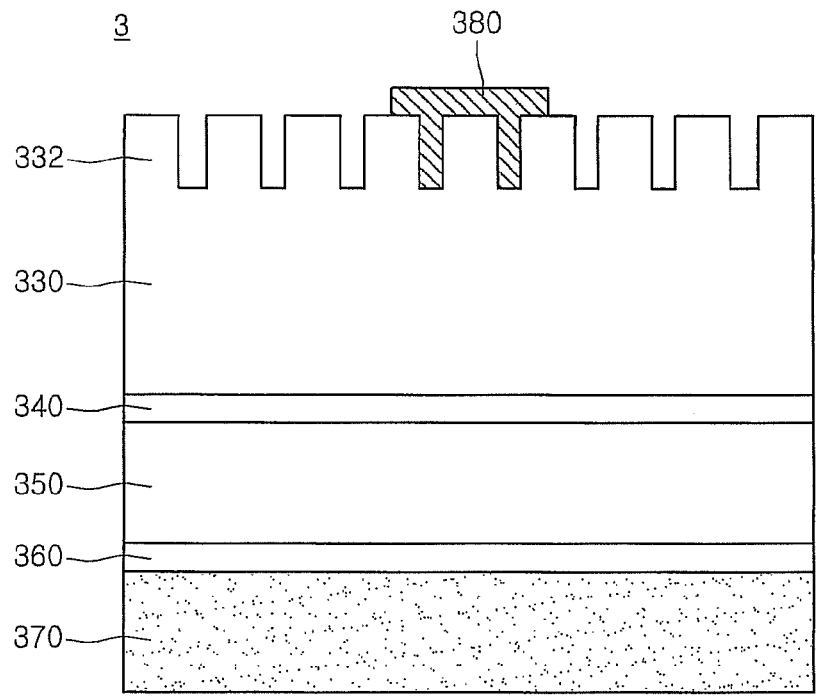
FIG. 9 is a cross-sectional view illustrating a light emitting device according to a third embodiment.

FIG. 9 is a cross-sectional view illustrating the light emitting device 3 according to the third embodiment.

Referring to FIG. 9, the light emitting device 3 includes a conductive support member 370, a reflective layer 360 disposed on the conductive support member 370, a second conductive type semiconductor layer 350 disposed on the reflective layer 360, an active layer 340 disposed on the second conductive type semiconductor layer 350, a first conductive type semiconductor layer 330 disposed on the active layer 340 and including a roughness pattern 332, and a third electrode 380 disposed on the first conductive type semiconductor layer 330.

The first conductive type semiconductor layer 330 includes the roughness pattern 332 in the upper portion thereof.

For example, the roughness pattern 332 may be formed by performing an etching process, using the second intermediate refraction layer 227 of FIG. 7 as a mask, on the first conductive type semiconductor layer 330.

That is, an etching process using the second intermediate refraction layer 227 of FIG. 7 as a mask is performed on the first conductive type semiconductor layer 330 to form the roughness pattern 332, then, the second intermediate refraction layer 227 is removed, and then, the third electrode 380 is formed on the first conductive type semiconductor layer 330 to form the light emitting device 3.

The roughness pattern 332 improves the extraction efficiency of light emitted from the light emitting device 3.

Figure 10:
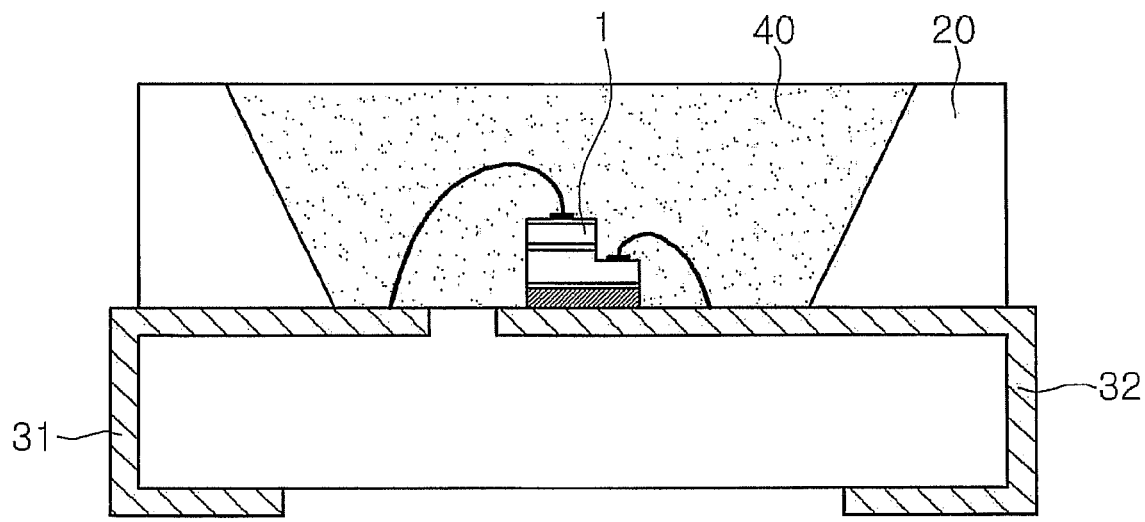
FIG. 10 is a cross-sectional view illustrating a light emitting package including a light emitting device according to an embodiment.

FIG. 10 is a cross-sectional view illustrating a light emitting package including a light emitting device according to an embodiment.

Referring to FIG. 10, the light emitting device package according to the current embodiment includes a body 20, a first electrode layer 31 and a second electrode layer 32 disposed in the body 20, the light emitting device 1 disposed in the body 20 and electrically connected to the first electrode layer 31 and the second electrode layer 32, and a molding member 40 surrounding the light emitting device 1. In FIG. 10, the light emitting device package includes the light emitting device 1 according to the first embodiment, but the present disclosure is not limited thereto. and thus, the light emitting device package may include other light emitting devices according to other embodiments.

The body 20 may be formed of a silicon material, a synthetic resin material, or a metal material. An inclined surface may be disposed around the light emitting device 1.

The first electrode layer 31 and the second electrode layer 32 are electrically separated from each other and supply power to the light emitting device 1. Also, the first electrode layer 31 and the second electrode layer 32 may reflect light generated in the light emitting device 1 to improve light efficiency, and may release heat generated in the light emitting device 1 to the outside.

The light emitting device 1 may be disposed on the body 20 or on the first electrode layer 31 or the second electrode layer 32.

The light emitting device 1 is electrically connected to the first electrode layer 31 and the second electrode layer 32 through wires in FIG. 10, but the present disclosure is not limited thereto. For example, the light emitting device 1 may be electrically connected to the first electrode layer 31 and the second electrode layer 32 using a flip chip method or a die bonding method.

The molding member 40 may surround the light emitting device 1 to protect the light emitting device 1. The molding member 40 may include a phosphor to vary a wavelength of light emitted form the light emitting device 1.

The light emitting device package may include at least one of the light emitting devices according to the above embodiments, but the present disclosure is not limited thereto. The light emitting device package may be provided in plurality on a substrate, and a light guide panel, a prism sheet, a spread sheet, and a fluorescent sheet may be disposed as optical members in the path of light emitted from the light emitting device package. The light emitting device package, the substrate, and the optical member may function as a lighting system such as a backlight unit, a lighting unit, an indicating device, a lamp, and a road lamp.

Figure 11:
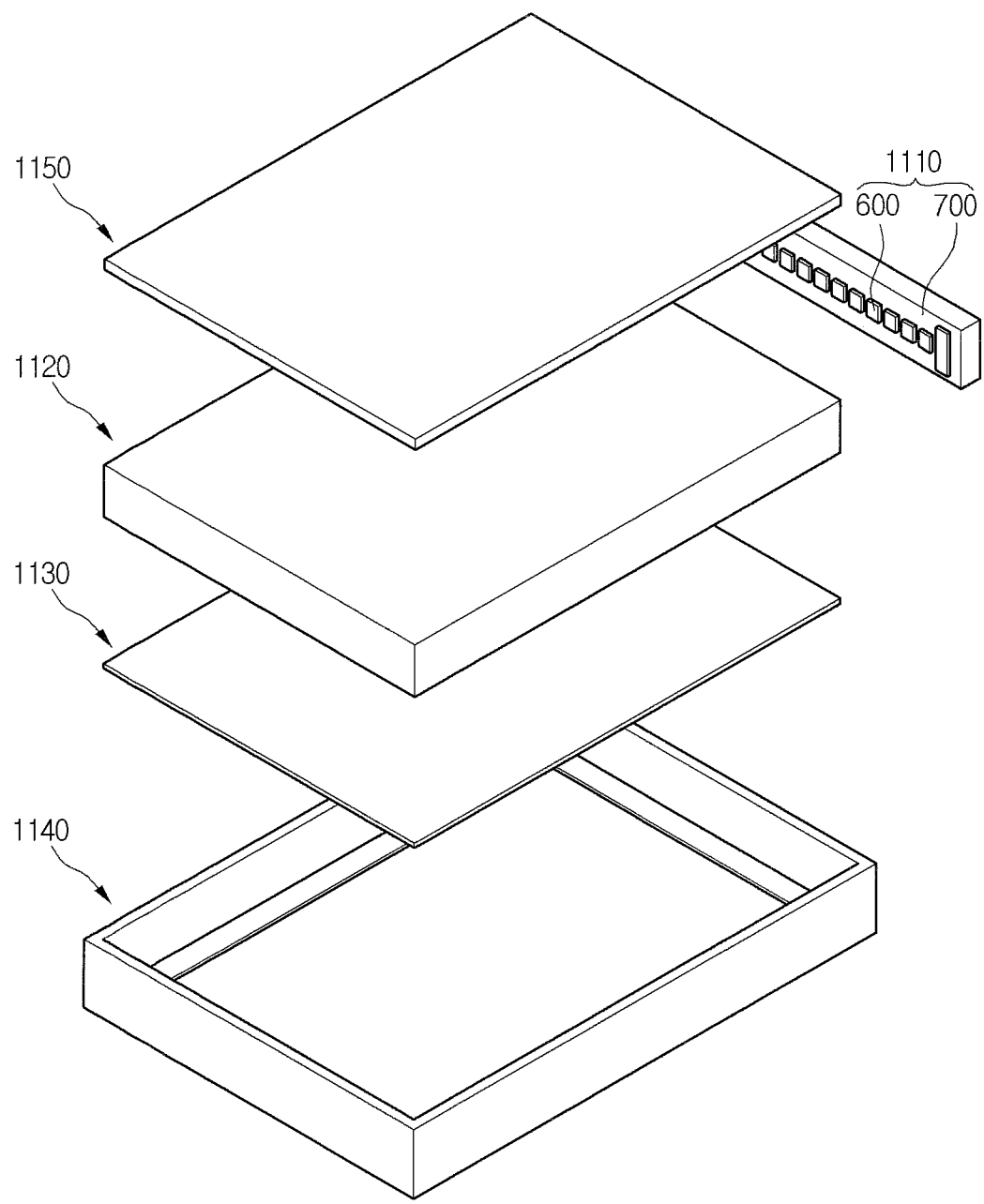
FIG. 11 is a perspective view illustrating a backlight unit including a light emitting device according to an embodiment.

FIG. 11 is a perspective view illustrating a backlight unit including a light emitting device or light emitting device package according to an embodiment. A backlight unit 1100 of FIG. 11 is just an example of a lighting system, and thus, the present disclosure is not limited thereto.

Referring to FIG. 11, the backlight unit 1100 may include a bottom cover 1140, a light guide member 1120 disposed within the bottom cover 1140, and a light emitting module 1110 on at least one surface or lower surface of the light guide member 1120. A reflective sheet 1130 may be disposed under the light guide member 1120.

The bottom cover 1140 may have a box shape with an open upper surface to receive the light guide member 1120, the light emitting module 1110, and the reflective sheet 1130, and be formed of metal or resin, but the present disclosure is not limited thereto.

The light emitting module 1110 may include a substrate 700 and a plurality of light emitting device packages 600 installed on the substrate 700. The light emitting device packages 600 provide light to the light guide member 1120. In the light emitting module 1110 according to the current embodiment, the light emitting device packages 600 are installed on the substrate 700, but light emitting devices according to an embodiment may be directly installed on the substrate 700.

The light emitting module 1110 may be disposed on at least one inner surface of the bottom cover 1140 to provide light to at least one surface the light guide member 1120.

However, the light emitting module 1110 may be disposed under the light guide member 1120 within the bottom cover 1140 to provide light to the bottom surface of the light guide member 1120. That is, the position of the light emitting module 1110 may be changed in various ways according to a design, and thus, the present disclosure is not limited thereto.

The light guide member 1120 may be disposed within the bottom cover 1140. The light guide member 1120 may receive light from the light emitting module 1110 and form a surface light source, and then, guide the surface light source to a display panel (not shown).

For example, the light guide member 1120 may be a light guide panel (LGP). For example, the light guide panel may be formed of one of acrylic resin such as polymethyl methacrylate (PMMA), polyethylene terephthalate (PET), cycloolefin copolymer (COC), poly carbonate (PC), and polyethylene naphthalate (PEN) resin.

An optical sheet 1150 may be disposed on the upper side of the light guide member 1120.

For example, the optical sheet 1150 may include at least one of a spread sheet, a light collecting sheet, a brightness enhancement sheet, and a fluorescent sheet. For example, the optical sheet 1150 may be formed by stacking a spread sheet, a light collecting sheet, a brightness enhancement sheet, and a fluorescent sheet. In this case, the spread sheet uniformly spreads light emitted from the light emitting module 1110, and the light collecting sheet collects the spread light on a display panel (not shown). At this point, light emitted from the light collecting sheet is randomly polarized light. The brightness enhancement sheet may increase a polarization degree of light emitted from the light collecting sheet. For example, the light collecting sheet may be a horizontal and/or vertical prism sheet. For example, the brightness enhancement sheet may be a dual brightness enhancement film. The fluorescent sheet may be a light transmitting plate or film including a phosphor.

The reflective sheet 1130 may be disposed under the light guide member 1120. The reflective sheet 1130 may reflect light, emitted through the bottom surface of the light guide member 1120, to a light emitting surface of the light guide member 1120.

The reflective sheet 1130 may be formed of resin having high reflectivity, such as PET, PC, and PVC, but the present disclosure is not limited thereto.

Figure 12:
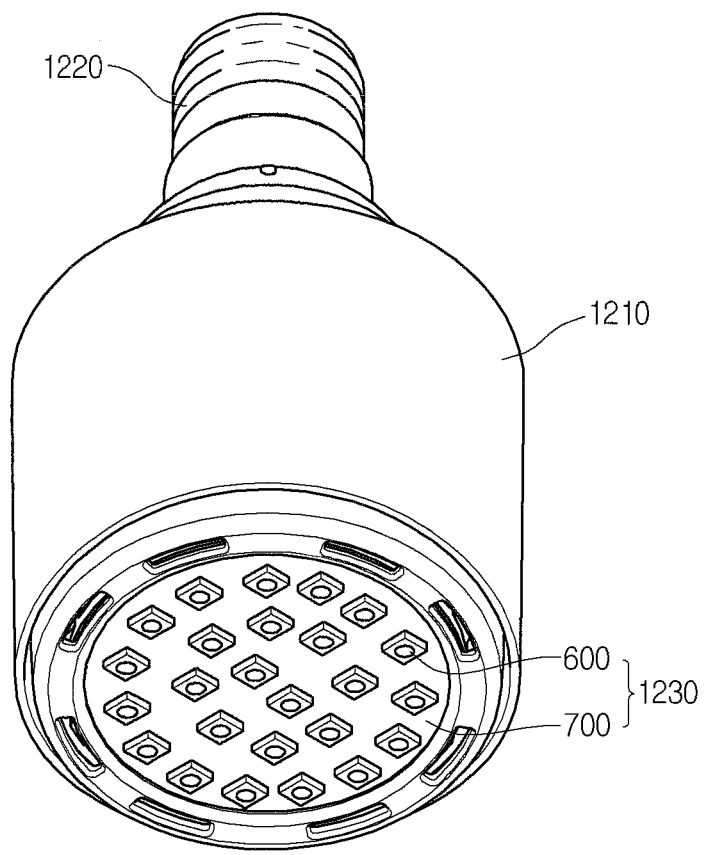
FIG. 12 is a perspective view illustrating a lighting system including a light emitting device package according to an embodiment.

FIG. 12 is a perspective view illustrating a lighting system including a light emitting device or light emitting device package according to an embodiment. However, a lighting system 1200 illustrated in FIG. 12 is just an example of a lighting system, and thus, the present disclosure is not limited thereto.

Referring to FIG. 12, the lighting system 1200 may include a case body 1210, a light emitting module 1230 disposed in the case body 1210, and a connection terminal 1220 disposed in the case body 1210 to receive power from an external power source.

The case body 1210 may be formed of a material having an improved heat dissipation characteristic. For example, the case body 1210 may be formed of a metal material or resin material.

The light emitting module 1230 may include a substrate 700 and at least one light emitting device package 600 mounted on the substrate 700. In the light emitting module 1110 according to the current embodiment, the light emitting device packages 600 are installed on the substrate 700, but the light emitting devices 100 may be directly installed on the substrate 700.

A circuit pattern may be printed on an insulation material to form the substrate 700. For example, the substrate 700 may include a printed circuit board (PCB), a metal core PCB, a flexible PCB, or a ceramic PCB.

Also, the substrate 700 may be formed of a material that can effectively reflect light. A surface of the substrate 700 may be coated with a colored material, e.g., a white or silver-colored material by which light is effectively reflected.

At least one light emitting device package 600 may be mounted on the substrate 700. Each light emitting device package 600 may include at least one light emitting diode (LED). The light emitting diode may include a colored light emitting diode that emits red, green, blue, or white light, and an UV light emitting diode that emits ultraviolet (UV) light.

The light emitting module 1230 may have various combinations of light emitting diodes to obtain intended colors and brightness. For example, a white light emitting diode, a red light emitting diode, and a green light emitting diode may be disposed in combination with each other to secure a high color rendering index (CRI). A fluorescent sheet may be disposed in the path of light emitted from the light emitting module 1230, and changes the wavelength of the light emitted from the light emitting module 1230. For example, when light emitted from the light emitting module 1230 has a blue wavelength band, the fluorescent sheet may include a yellow phosphor, and thus, the light emitted from the light emitting module 1230 is finally perceived as white light through the fluorescent sheet.

The connection terminal 1220 is electrically connected to the light emitting module 1230 to supply power thereto. Referring to FIG. 12, the connection terminal 1220 is screwed in the form of a socket into an outer power source, but the present disclosure is not limited thereto. For example, the connection terminal 1220 may be inserted in the form of a pin into an outer power source, or be connected to an outer power source through a wire.

In the above-described lighting system, at least one of the light guide member, the spread sheet, the light collecting sheet, the brightness enhancement sheet, and the fluorescent sheet is disposed in the path of light emitted from the light emitting module to obtain an intended optical effect.

As described above, the lighting system according to the embodiments includes the light emitting device or light emitting device package having improved light extraction efficiency, thereby improving the characteristics thereof.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a second conductive type semiconductor layer;
an active layer on the second conductive type semiconductor layer;
a first conductive type semiconductor layer on the active layer;
an intermediate refraction layer on the first conductive type semiconductor layer; and
an electrode on the intermediate refraction layer,
wherein the intermediate refraction layer includes a plurality of patterns that are spaced apart from one another,
wherein the electrode is disposed on the patterns of the intermediate refraction layer and in between the patterns such that the electrode is electrically connected to the first conductive type semiconductor layer between the patterns, and
wherein the intermediate refraction layer has a refractivity that is smaller than a refractivity of the first conductive type semiconductor layer, and the refractivity of the intermediate refraction layer is greater than a refractivity of air.

2. The light emitting device according to claim 1, further comprising at least one of a conductive support member and a reflective layer under the second conductive type semiconductor layer.

3. The light emitting device according to claim 1, wherein the intermediate refraction layer includes a plurality of polygonal columns or a plurality of cylinders that are spaced apart from one another.

4. The light emitting device according to claim 1, wherein the intermediate refraction layer has a thickness ranging from about 0.5 μm to about 1.0 μm.

5. The light emitting device according to claim 1, further comprising a substrate on the intermediate refraction layer, wherein the refractivity of the intermediate refraction layer is greater than a refractivity of the substrate.

6. The light emitting device according to claim 5, wherein the intermediate refraction layer has a thickness ranging from about 0.05 μm to about 0.1 μm.

7. The light emitting device according to claim 5, wherein the substrate is formed of at least one of SiC, Si, GaAs, GaN, ZnO, Si, GaP, InP, and Ge.

8. The light emitting device according to claim 5, wherein the substrate is formed of sapphire ($Al_2O_3$), and the refractivity of the substrate ranges from about 1.7 to about 1.8.

9. The light emitting device according to claim 5, further comprising:
an undoped semiconductor layer between the substrate and the intermediate refraction layer; and
another intermediate refraction layer between the substrate and the undoped semiconductor layer.

10. The light emitting device according to claim 9, wherein the another intermediate refraction layer comprises a same material as that of the intermediate refraction layer.

11. The light emitting device according to claim 1, wherein the intermediate refraction layer comprises at least one of AlN, GaN, AlGaN, InGaN, AlInGaN, AlInN, and InN.

12. The light emitting device according to claim 11, wherein the intermediate refraction layer comprises AlN, and the refractivity of the intermediate refraction layer ranges from about 2.1 to about 2.2.

13. The light emitting device according to claim 1, wherein the first conductive type semiconductor layer is formed of a semiconductor material having a composition formula of $In_xAl_yGa_{1-x-y}N$, where $0 \leq x \leq 1$, $0 \leq y \leq 1$, and $0 \leq x+y \leq 1$.

14. The light emitting device according to claim 1, wherein a thickness of the electrode is more than a thickness of the patterns of the intermediate refraction layer.

15. A light emitting device package comprising:
a body;
a first electrode layer and a second electrode layer in the body; and
a light emitting device in the body, the light emitting device being electrically connected to the first and second electrode layers,
wherein the light emitting device includes:
a second conductive type semiconductor layer;
an active layer on the second conductive type semiconductor layer;
a first conductive type semiconductor layer on the active layer;
an intermediate refraction layer on the first conductive type semiconductor layer; and
an electrode on the intermediate refraction layer,
wherein the intermediate refraction layer includes a plurality of patterns that are spaced apart from one another,
wherein the electrode is disposed on the patterns of the intermediate refraction layer and in between the patterns such that the electrode is electrically connected to the first conductive type semiconductor layer between the patterns, and
wherein the intermediate refraction layer has a refractivity that is smaller than a refractivity of the first conductive type semiconductor layer, and refractivity of the intermediate refraction layer is greater than a refractivity of air.

16. The light emitting device package according to claim 15, further comprising at least one of a conductive support member and a reflective layer under the second conductive type semiconductor layer.

17. The light emitting device according to claim 15, wherein a thickness of the electrode is more than a thickness of the patterns of the intermediate refraction layer.

* * * * *